United States Patent [19]
Lysinger

[11] Patent Number: 5,982,188
[45] Date of Patent: *Nov. 9, 1999

[54] TEST MODE CONTROL CIRCUIT OF AN INTEGRATED CIRCUIT DEVICE

[75] Inventor: Mark Alan Lysinger, Carrollton, Tex.

[73] Assignee: STMicroelectronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/282,047

[22] Filed: Jul. 29, 1994

[51] Int. Cl.[6] ............................. G01R 15/12; G06F 11/00
[52] U.S. Cl. ............................ 324/763; 324/22.5
[58] Field of Search ................ 324/73.1, 158.1, 324/765, 763, 719; 437/8; 371/22.1, 22.2; 365/201; 438/14, 17

[56] References Cited

U.S. PATENT DOCUMENTS

| | | | |
|---|---|---|---|
| 4,336,495 | 6/1982 | Hapke | 324/765 |
| 4,398,146 | 8/1983 | Draheim et al. | 324/765 |
| 4,714,876 | 12/1987 | Gay et al. | 324/158.1 |
| 4,771,407 | 9/1988 | Takemae et al. | 365/226 |
| 4,816,757 | 3/1989 | Hutchins | 324/763 |
| 4,853,628 | 8/1989 | Gouldsberry et al. | 324/763 |
| 4,860,259 | 8/1989 | Tobita | 365/201 |
| 4,970,454 | 11/1990 | Stambaugh et al. | 324/765 |
| 4,975,641 | 12/1990 | Tanaka et al. | 324/763 |
| 5,019,772 | 5/1991 | Dreibelbis et al. | 324/763 |
| 5,065,091 | 11/1991 | Tobita | 324/763 |
| 5,161,159 | 11/1992 | McClure et al. | 324/158.1 |
| 5,339,028 | 8/1994 | Ovens et al. | 324/158.1 |
| 5,347,519 | 9/1994 | Cooke et al. | 371/22.1 |
| 5,402,063 | 3/1995 | Kim | 324/158.1 |
| 5,517,109 | 5/1996 | Albean et al. | 324/158.1 |

*Primary Examiner*—Vinh P. Nguyen
*Attorney, Agent, or Firm*—Theodore E. Galanthay; Lisa K. Jorgenson; R. Michelle Larson

[57] ABSTRACT

According to the present invention, entry into the test mode of an integrated circuit device is possible even when there is no device pin dedicated to a test mode function. Test mode control circuitry allows a pin of the integrated circuit device to be double mapped to a normal operation function and to a test mode function. The test mode control circuitry has a polarity circuit having a polarity bond pad and a fuse circuit having a fuse element, either of which may determine when the polarity of the pin is representative of a test mode function. Either down-bonding the polarity bond pad to the lead frame of the integrated circuit device or blowing the fuse renders the pin representative of the test mode function. Additionally, once the test mode of the device is entered, the device may be adequately stress tested. Holding an external clock signal of the integrated circuit device to a given logic state ensures that the device is stress tested for the duration of time the external clock signal is held to the given logic state.

13 Claims, 1 Drawing Sheet

5,982,188

TEST MODE CONTROL CIRCUIT OF AN INTEGRATED CIRCUIT DEVICE

BACKGROUND OF THE INVENTION

The present invention relates generally to integrated circuit devices, and more specifically to integrated circuit devices which have no device pin assigned to the test mode function.

Stress testing is a critical step in the manufacture of an integrated circuit device. Stress testing provides important information on the reliability of the device and may indicate latent manufacturing and design problems which may then be remedied before the device is actually sold to a customer. Stress testing of an integrated circuit device is often performed during the burn-in phase of device manufacture when a test mode of the device is entered and the device is subjected to various stress tests well known in the art.

Often the testing of an integrated circuit device becomes complicated when no device pin is dedicated to the test mode function. This often occurs in high performance parts where every pin of the device is dedicated to functions, other than testing, which are necessary to the normal operation of the device. The very fast Burst Random Access Memory (RAM) device is an example of a high performance integrated circuit device which has no pins dedicated to entering a test mode.

The very fast Burst RAM device is a synchronous SRAM device which has a burst mode and is therefore used as an integral component in cache memory systems, often as a burstable, high performance secondary cache for microprocessors such as the Intel 486 or the Motorola family of microprocessors. SGS-Thomson Microelectronics, Inc. manufactures the M62486(Q) for use with the Intel i486 family of microprocessors and the M62940A for use with the Motorola MCM62940 family of microprocessors. The M62940A device produces a burst of data in a straight binary count (00, 01, 10, 11, etc.) as needed by the Motorola microprocessor, while the M62486(Q) device produces a more complicated burst of data which may count forwards or backwards in a binary count as a function of the initial state of the least significant address bit. Thus, the very fast Burst RAM device of either type has a burst counter which controls the burst mode, and the type of count provided by the burst counter to the microprocessor is a function of the type of count required by the microprocessor, as described above.

The very fast Burst RAM device uses a reserved pin (RES bar) to select the burst count desired. Typically, the reserved pin is tied to a low logic level, Gnd, for the Intel compatible M62486R(Q) device and is tied to a high logic level, Vcc, for the Motorola compatible M62940A device. With the reserved pin thus committed to the function of defining the type burst count the very fast Burst RAM will produce, the reserved pin is not readily available to help define the test mode of the device. Initially, the test mode for the Burst RAM was entered by applying a negative super voltage on the reserved pin signal (RES bar) and appropriately applying power supply voltages Vcc and Vss to two address pins in order to define the desired test mode. However, this approach was too complicated for the burn-in ovens to handle. Thus, there exists a current need in the art to be able to utilize an integrated device pin already committed to a normal operation function to a test mode function so that the device may be entered into a test mode for stress testing during burn-in of the device.

Another concern with stress testing of integrated circuit devices, such as the very fast Burst RAM, is that adequate stressing of the device be accomplished such that acceptable levels of device reliability are achieved. The very fast Burst RAM device, for instance, is fully synchronous and has many internally self timed clocks. For both read and write cycles, the very fast Burst RAM device times out when the read or write operation is complete. While this time out feature ensures low power consumption, it does not stress the device throughout a memory cycle and thus does not allow for adequate stress testing of the device. A device will undergo burn-in testing during the production flow and, if the device is tested while the device times out, maximum stressing of the device is not obtained. Thus, is it important to not only be able to enter a device test mode, but to ensure that once a test mode is entered that the device is adequately tested.

SUMMARY OF THE INVENTION

It would be advantageous in the art to enter a test mode for the purpose of stress testing an integrated circuit device even if no device pin is dedicated to the test mode function.

It would further be advantageous in the art to ensure that once a test mode of an integrated circuit device is entered, the integrated circuit device is adequately stress tested.

Therefore, according to the present invention, entry into the test mode of an integrated circuit device is possible even when there is no device pin dedicated to a test mode function. Test mode control circuitry allows a pin of the integrated circuit device to be double mapped to a normal operation function and to a test mode function. Once the test mode of the device is entered, the present invention ensures that the device may be adequately stress tested.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing, wherein:

DESCRIPTION OF THE INVENTION

Figure 1:
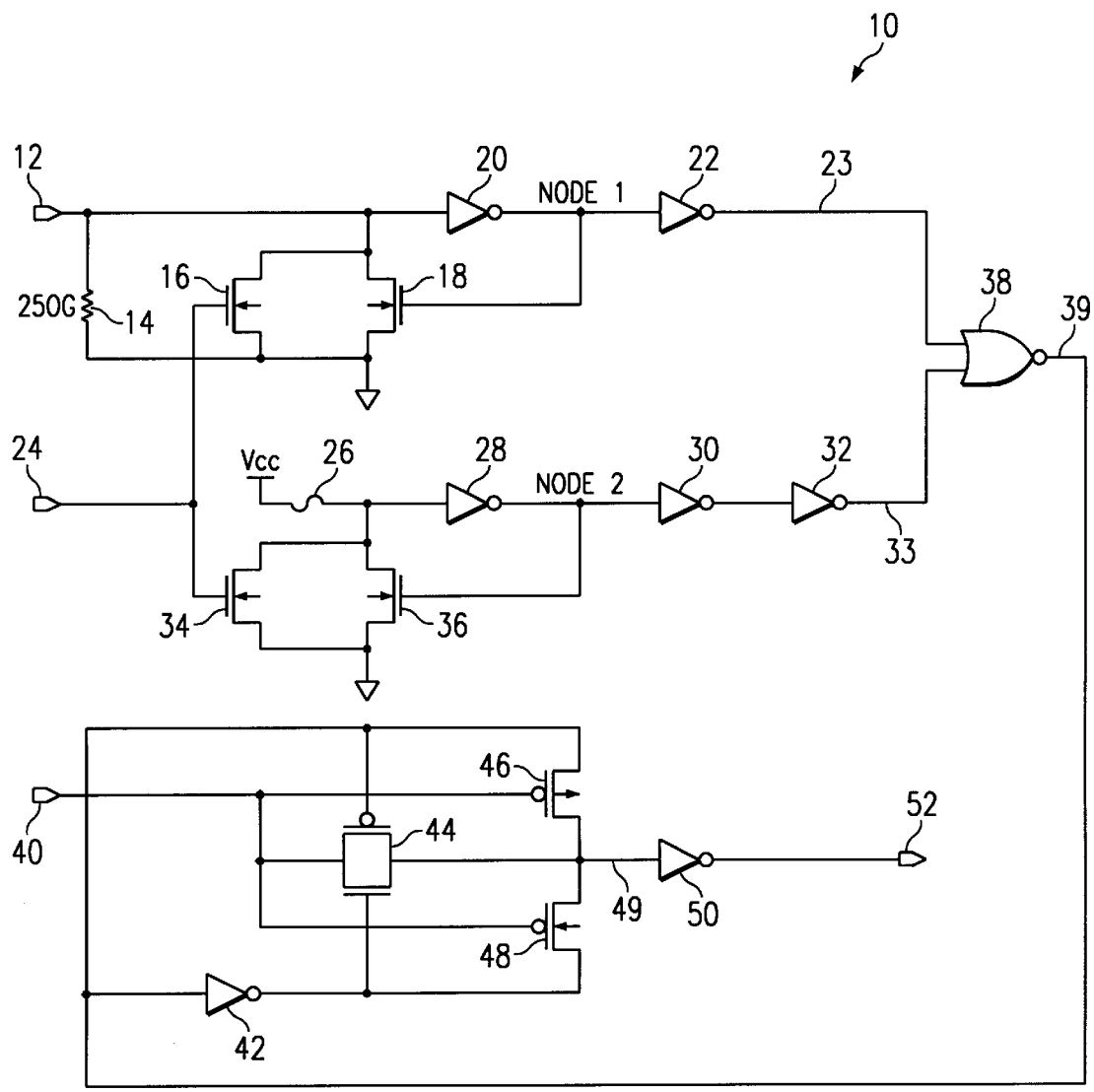
FIG. 1 is a test mode control circuit for a very fast Burst RAM device, according to the present invention.

The present invention allows entry into the test mode of an integrated circuit device even where there is no device pin dedicated to the test mode function. Additionally, the present invention ensures that once the test mode of the device is entered, that the device may be adequately stress tested by preventing the device from timing out during stress testing. The present invention achieves both of these goals through the use of test mode control circuitry which allows a pin dedicated to normal operation to be double mapped to a test mode function and which prevents the device under test from timing out during stress testing of the device. It is important to note, as is well known in the art, that testing during the test mode is not limited to stress testing. Many other types of testing, such as characteristic testing and parameter testing, may be performed as well.

Initially, as described in the Background of the Invention, the Burst RAM test mode was entered by applying a negative super voltage on the reserved pin signal (RES bar) and appropriately applying power supply voltages Vcc and Vss on two address pins in order to define the desired test mode. However, this approach was too complicated for the burn-in ovens to handle. The present invention allows the test mode to be controlled at the burn-in stage of the production flow.

According to the present invention, the reserved pin signal (RES bar) continues to control the type of burst count and also controls the test mode of the device. Typically, the test mode is entered into when the RES bar pin signal is equal to power supply voltage Vcc, but because the reserved pin signal (RES bar) now controls two different functions, the burst count and the test mode, problems may arise when the data sheet for the device indicates that the burst count is produced when the RES bar pin signal is equal to Vcc. Such is the case for the M62940A very fast Burst RAM device which generates a straight binary burst count for use with Motorola's MCM62940 microprocessor and whose data sheet specifies that the straight binary burst count is generated when RES bar pin signal is equal to Vcc. A similar problem does not exist for the M62486R(Q) very fast Burst RAM device which generates a complicated burst count, because the data sheet for such a device indicates that the burst count is produced when the RES bar pin signal is equal to Vss.

Since the M62940A straight binary count device can not both enter a test mode and generate a straight binary count when RES bar signal is equal to Vcc, test mode control circuitry for a very fast Burst RAM device must allow the test mode to be entered into when RES bar signal is equal to either Vcc or Vss, depending on whether the device generates a straight binary count compatible with the Motorola microprocessor or a more complicated burst count compatible with the Intel microprocessor. Referring to FIG. 1, test mode control circuitry 10, according to the present invention, is shown. Test mode control circuitry 10 is comprised of resistor 14, transistors 16, 18, 34, 36, 46, 48, inverters 20, 22, 28, 30, 32, 42, 50, fuse 26, NOR gate 38, and transmission gate 44. These components are controlled by or generate the following signals, as shown: Polarity signal 12, Power-On Reset signal 24, Reserve Derivative signal 40, Test Mode Enable signal 52, and signals 23, 33, 39, and 49.

Power-On Reset signal 24 is a high logic level when power is first applied to the device; after several microseconds, Power-On Reset signal 24 goes to a low logic level. Starting Power-On Reset signal 24 at a high logic state upon device power up ensures that the latches at Node 1 and Node 2 are initialized in a high logic state. This feature addresses the possibility of low level leakage across blown fuse 26.

Test mode control circuitry 10 is comprised of polarity circuitry and fuse circuitry, either of which may determine when the reserved pin is representative of a test mode. Reserve Derivative signal 40 is pin buffered by the reserved pin signal (RES bar) described above. Polarity signal 12 is physically representative of a bond pad of the very fast Burst RAM device which may be selectively down-bonded to the lead frame of the device to power supply voltage Vcc. Either Polarity signal 12 or fuse 26 determine the polarity that reserve pin signal RES bar must be in for test mode. If Polarity signal 12 is not down-bonded to the lead frame of the device (Vcc), then the 250 Giga Ohm resistor 14 holds Polarity signal 12 at power supply Vss and signal 23 will be a low logic level. If fuse 26 is not blown, then signal 33 will be a low logic level. When both signal 23 and signal 33 are a low logic level, then signal 39, the output signal of NOR gate 38 which controls transmission gate 44, is a high logic level. This causes the output signal 49 of transmission gate 44 to be equal to the inverse of Reserve Derivative signal 40 and Test Mode Enable signal 52 tracks Reserve Derivative signal 40. So, when RES bar pin is brought to the Vss voltage level, Reserve Derivative signal 40 is a low logic level, and Test Mode Enable signal is a low logic level such that the test mode is disabled. Thus, not blowing fuse 26 or not down-bonding Polarity signal 12 matches the test mode definition of a very fast Burst RAM device wherein the test mode is entered when RES bar is equal to Vcc.

Conversely, blowing fuse 26 or down-bonding Polarity signal 12 to the device lead frame matches the requirement for a straight binary count device where RES bar signal is taken to Vss when the device is operating in the test mode. If Polarity signal 12 is down-bonded to Vcc or if fuse 26 is blown, then signal 39 is a low logic level, signal 49 tracks Reserve Derivative signal 40, and Test Mode Enable signal 52 is equal to Reserve Derivative signal 40 inverted. So, when RES bar pin is brought to the Vcc voltage level, Reserve Derivative signal 40 is a high logic level, and Test Mode Enable signal 52 is a low logic level such that the test mode is disabled.

It is important to note that, according to the present invention, the burst count type, such as straight binary or a more complicated burst count, is not important to the test mode of the device. During the test mode, it is the memory array of the device which is being stressed and so the order of the addressing controlled by the burst counter is not important.

In order to achieve maximum benefit through stressing the device, the test mode of the device on the very fast Burst RAM does not make use of the internally timed read and writes of the device, such that the device does not time out when the read or write operation is completed. In this way, while the device is in a test mode, it is continually stressed during the burn-in phase of the production flow. During the test mode, the falling edge of the external clock signal (K) of the device is used to terminate reads and writes such that the device is stressed for the period of time K is a high logic level. Thus, the length of time K is a high logic level may be extended to correspondingly extend the duration of the time the integrated circuit device is stressed. For instance, the duty cycle of the device may be adjusted such that duty cycle high is 90% and duty cycle low is 10% and thus the device is stress tested 90% of the cycle. Additionally, the cycle time of the device may be lengthened to lengthen the duration of the external clock signal K such that the device may be stressed for a longer period of time, as desired.

According to the present invention, test mode control circuitry of an integrated circuit device, such as a very fast Burst RAM, is able to control test mode entry of a device, through double mapping of a device pin, even when the device does not have a pin dedicated to the test mode. This test mode control circuitry allows a single die to be adequately stressed during burn-in testing of the device. Additionally, in the fast Burst RAM example, a single Burst RAM die may be selectively chosen to have the straight binary count option or the complicated burst count option. Thus, by down-bonding a Polarity signal pad to the device lead frame or blowing a fuse, all options are available with a single die.

While the invention has been particularly shown and described with reference to a preferred embodiment, it will be understood by those skilled in the art that various changes in form and detail may be made therein without departing from the spirit and scope of the invention.

What is claimed is:

1. Test mode control circuitry of an integrated circuit device, comprising:

a polarity circuit capable of being down-bonded to a lead frame of the integrated circuit device that receives a polarity signal and generates a polarity circuit output signal;

a fuse circuit, having a fuse element, that generates a fuse circuit output signal;

a logic element that gates the polarity circuit output signal and the fuse circuit output signal to produce an output signal; and a transmission gate, controlled by the output signal produced by the logic element, that receives a control signal applied to a pin of the integrated circuit device and produces a test mode enable signal that tracks the control signal, wherein when the polarity signal is not down-bonded to the lead frame of the integrated circuit device and the fuse element of the fuse circuit is not blown, the test mode enable signal is representative of a test mode function of the integrated circuit device when the control signal is equal to a first logic state, and wherein when the polarity signal is down-bonded to the lead frame of the integrated circuit device or the fuse element of the fuse circuit is blown, the test mode enable signal is representative of the test mode function when the control signal is equal to a second logic state.

2. The circuitry of claim 1, wherein a period of time during which the integrated circuit device is subjected to a stressing condition while in the test mode function is determined by an external clock signal of the device.

3. The circuitry of claim 1, wherein the integrated circuit device has a cycle time, and the cycle time may be extended to lengthen the duration of the external clock signal such that the integrated circuit device may be subjected to the stressing condition for a longer period of time.

4. The circuitry of claim 1, wherein the integrated circuit device is a Burst Random Access Memory (RAM).

5. The circuitry of claim 1, wherein when the polarity signal is not down-bonded to the lead frame of the integrated circuit device and the fuse element of the fuse circuit is not blown, the polarity circuit output signal is equal to the second logic state, the fuse circuit output signal is equal to the second logic state, and the output signal of the logic element is equal to the first logic state.

6. The circuitry of claim 1, wherein when the polarity signal is down-bonded to the lead frame of the integrated circuit device or the fuse element of the fuse circuit is blown, the output signal of the logic element is equal to the second logic state.

7. The circuitry of claim 1, wherein when the polarity signal is not down-bonded to the lead frame of the integrated circuit device and the fuse element of the fuse circuit is not blown, the test mode enable signal is not representative of the test mode function of the integrated circuit device when the control signal is the second logic state.

8. The circuitry of claim 1, wherein when the polarity signal is down-bonded to the lead frame of the integrated circuit device or the fuse element of the fuse circuit is blown, the test mode enable signal is not representative of the test mode function when the control signal is equal to the first logic state.

9. A method for selectively defining the logic state of a signal of a package pin of an integrated circuit device that is required to enter a test mode of the integrated circuit device, comprising the steps of:

defining a test mode enable signal produced by a test mode control circuit of the integrated circuit device to be representative of a test mode of the integrated circuit device when a control signal supplied to the test mode control circuit is a first logic state and a polarity signal supplied to the test mode control circuit is not down-bonded to a lead frame of the integrated circuit device and a fuse element of the test mode control circuit is not blown; and defining the test mode enable signal to be representative of the test mode when the control signal is a second logic state and the polarity signal is down-bonded to the lead frame or the fuse element is blown.

10. The method of claim 9, further comprising the step of:

determining a period of time during which the integrated circuit device is subjected to a stressing condition while in the test mode by an external clock signal of the device.

11. The method of claim 10, wherein the integrated circuit device has a cycle time, and the cycle time may be extended to lengthen the duration of the external clock signal such that the integrated circuit device may be subjected to the stressing condition for a longer period of time.

12. The circuitry of claim 9, wherein the integrated circuit device is a Burst Random Access Memory (RAM).

13. The method of claim 9, wherein during the test mode, the integrated circuit device is subjected to a stress test.

* * * * *